United States Patent
Florian et al.

(10) Patent No.: US 7,208,862 B2
(45) Date of Patent: Apr. 24, 2007

(54) PIEZOELECTRIC COMPONENT AND METHOD FOR THE PRODUCTION THEREOF

(75) Inventors: Heinz Florian, Bad Gams (AT); Sigrid Ragossnig, Gross St. Florian (AT)

(73) Assignee: Epcos AG, Munich (DE)

( * ) Notice: Subject to any disclaimer, the term of this patent is extended or adjusted under 35 U.S.C. 154(b) by 255 days.

(21) Appl. No.: 10/501,974

(22) PCT Filed: Nov. 18, 2002

(86) PCT No.: PCT/DE02/04249

§ 371 (c)(1),
(2), (4) Date: Sep. 29, 2004

(87) PCT Pub. No.: WO03/061022

PCT Pub. Date: Jul. 24, 2003

(65) Prior Publication Data

US 2005/0035686 A1 Feb. 17, 2005

(30) Foreign Application Priority Data

Jan. 17, 2002 (DE) .................. 102 01 641

(51) Int. Cl.
*H01L 41/083* (2006.01)
*H01L 41/04* (2006.01)
(52) U.S. Cl. ...................... 310/366; 310/328
(58) Field of Classification Search ............ 310/328, 310/363–366
See application file for complete search history.

(56) References Cited

U.S. PATENT DOCUMENTS

| | | | |
|---|---|---|---|
| 4,978,881 | A | 12/1990 | Wakita et al. |
| 5,614,044 | A | 3/1997 | Nagayama et al. |
| 6,191,522 | B1 | 2/2001 | Reuter |

FOREIGN PATENT DOCUMENTS

| | | |
|---|---|---|
| DE | 19646511 | 5/1998 |
| DE | 19855221 | 5/2000 |
| DE | 19905340 | 8/2000 |
| DE | 19928177 | 1/2001 |
| JP | 2000-049396 | 2/2000 |
| JP | 2000-077733 | 3/2000 |
| WO | WO00/33395 | 6/2000 |
| WO | WO00/79615 | 6/2000 |

*Primary Examiner*—Tom Dougherty
*Assistant Examiner*—J. Aguirrechea
(74) *Attorney, Agent, or Firm*—Fish & Richardson P.C.

(57) ABSTRACT

A piezoelectric component includes piezoelectric layers and electrode layers between at least some of the piezoelectric layers. The electrode layers define a middle segment in an interior of the piezoelectric layers and end segments located between ends of at least some of the electrode layers and an end of at least one of the piezoelectric layers. The piezoelectric layers include a first piezoelectric material at the end segments and a second piezoelectric material at the middle segment between electrode layers. The first piezoelectric material has a first expansion that is less than a second expansion of the second piezoelectric material.

16 Claims, 4 Drawing Sheets

PIEZOELECTRIC COMPONENT AND METHOD FOR THE PRODUCTION THEREOF

TECHNICAL FIELD

The invention relates to a piezoelectric component having a stack of piezoelectric layers stacked on top of one another and electrode layers arranged between them. Furthermore, the invention relates to a method for production of the piezoelectric component.

BACKGROUND

From the reference DE 199 053 40 A1, piezoelectric components of the type noted above are known, which are produced from ceramic material, using multilayer technology. PZT (lead zirconate titanate) is preferably used as the ceramic material. The components contain internal electrodes, which do not extend to the edge of the stack everywhere in the component. This results in so-called passive zones, in which only a very small electric field can be developed by applying electric voltage between the internal electrodes. As a result, the ceramic material is essentially non-polarized in these passive zones, and does not contribute to the lift of the piezoelectric component. There are also active zones, in which adjacent internal electrodes are arranged directly opposite one another, so that a high piezoelectric lift can be produced when voltage is applied. While compressive stress develops in the active zone of the component, the passive zones of the component are exposed to tensile stress. The material stress is greatest where the internal electrodes terminate in the interior of the stack, that is, at the transition between the active and passive zone. Because of peak effects, the electric field intensity becomes excessively high at the end of the internal electrodes. The field lines run together in a star-shaped pattern in the end zone of the internal electrodes, where they produce an especially strong electric field.

Known components have the disadvantage that cracks develop easily in regions of great tensile stress and, in the case of prolonged stress on the component, can continue along the internal electrodes into the interior of the stack. In particular, cracks can grow along the internal electrodes. As a result, the life of the components is limited, which constitutes a significant disadvantage in terms of their use.

SUMMARY

It is therefore the goal of the present invention to provide a piezoelectric component that has a long life.

This goal is achieved, according to the invention, via a piezoelectric component according to claim 1. Advantageous further developments of the invention, as well as a method for producing the piezoelectric component, are found in the additional claims.

A piezoelectric component contains a stack of piezoelectric layers stacked on top of one another and electrode layers arranged between them. The electrode layers have a middle segment in the interior of the stack, as well as an end segment. In this arrangement, the end segment is delimited by the interior side of a vertical edge zone of the stack. The end segments of the electrode layers are enclosed by a first piezoelectric material, whose relative expansion per electric field intensity applied is less than that of a second piezoelectric material, which is arranged in a middle region between two adjacent electrode layers.

The first piezoelectric material preferably extends into the edge zone.

As a result of a reduction in expansion of the ceramic material in the region of the end segments of the electrode layers, the mechanical stress in the zones of the end segments can be reduced. As a result, the invention has the advantage that stress on the materials is reduced and, therefore, the life of the component is increased. Thus, a gradient in the relative expansion develops in the piezoelectric layer between the end segment of one electrode layer and that of the electrode layer opposite this electrode layer, and its maximum is located in the center between the two electrode layers. Expansion decreases in the direction of the electrode layers.

To achieve an especially advantageous effect of increasing the life of the component, it is advantageous if the relative expansion of the first piezoelectric material comprises no more than 95% of the relative expansion of the second piezoelectric material.

The piezoelectric parameter $d_{33}$, as well as another piezoelectric parameter $d_{31}$, can be used as a measure of the relative expansion of the piezoelectric materials. These parameters are elements of the piezoelectric tension tensor, wherein $d_{33}$ describes the expansion of the piezoelectric material in the direction of an outer electric field parallel to the direction of polarity. The second piezoelectric parameter $d_{31}$ describes the shrinkage of the material in a direction perpendicular to the direction of this electric field. $d_{33}$ and $d_{31}$ have opposite signs, an expression of the preservation of the volume of the piezoelectric ceramic material.

It is also advantageous if the difference in relative expansion between the first piezoelectric material and the second piezoelectric material is even greater. This is the case when the relative expansion of the first piezoelectric material comprises no more than 90% of the relative expansion of the second piezoelectric material.

The increased stress on the piezoelectric component in the region of the electrode ends is not restricted to the end of the internal electrodes, but also affects the region of the internal electrodes adjacent to the electrode ends. For this reason, it is advantageous if the edge zone enclosed by the first piezoelectric material comprises at least 5% of the surface area of the electrode layer.

To increase the mechanical stability of the component, it is advantageous if the transition between the first piezoelectric material and the second piezoelectric material occurs gradually, that is, constantly, in relation to the relative expansion. As a result, an intermediate layer between two different piezoelectric materials is avoided, and this can additionally inhibit the development of cracks in the material.

In an advantageous embodiment, a gradual transition is achieved between the various piezoelectric materials, in that the first piezoelectric material is formed from the second piezoelectric material by diffusing in a doping material present in the electrode layers. Via diffusion of the doping material, which reduces the relative expansion of the piezoelectric material enclosing it, it is possible to achieve a gradual and not a sharp transition between different properties of the piezoelectric material.

In an advantageous embodiment, the electrode layers can contain copper, which is simultaneously the doping material that can modify the expansion behavior of a piezoelectric material.

The first piezoelectric material can, for example, be $Pb_{0.97}Zr_{0.54}Ti_{0.46}Nd_{0.02}O_3$, with a copper content of 4–10 mol. %. The second piezoelectric material can, for example, be the aforementioned first piezoelectric material, with a very small copper content of circa 2 mol. %.

The invention can, furthermore, be implemented in that the piezoelectric component is formed from a stack of layers having the layer sequence E-A-B-A-E, wherein E stands for an electrode layer, A for a ceramic film that contains the first piezoelectric material, and B for a ceramic film that contains the second piezoelectric material.

In this arrangement, it would be important to ensure that the sintering contraction values of the two piezoelectric materials must be adjusted to one another, so as to prevent tearing of the piezoelectric component during sintering. It is also important to ensure that the adjusted differences in the properties are not partially or fully offset by diffusion during sintering, that is, that the doping materials must have limited mobility.

Thus, in this exemplary embodiment the stack is constructed of electrode layers produced via silk-screening, for example, and piezoelectric layers formed by ceramic films.

The invention can, furthermore, be implemented in that the stack is comprised of layers having the layer sequence E-C-B-C-E, wherein E stands for an electrode layer, A for a ceramic film that contains the first piezoelectric material, and C for a layer formed by the two adjacent silk-screened layers. The first silk-screened layer contains the first piezoelectric material and covers the end segment of the adjacent electrode layer. The second silk-screened layer contains the second piezoelectric material and covers the middle segment of the adjacent electrode layers from both sides.

In an advantageous embodiment of the invention, the two silk-screened layers completely cover the layer B, and each extends to the inner edge of the end segments of the electrode layer. As a result, the layer structure can be continued throughout the entire stack without variations in thickness and without gaps.

It is especially advantageous if the component according to the invention is a monolithic sintered compact, which allows for a high degree of mechanical stability and can be produced easily and inexpensively via joint sintering of layers stacked on top of one another.

Furthermore, the invention is directed to a method for production of a piezoelectric component, where production takes place by sintering a stack of green films and electrode layers stacked on top of one another, and where the diffusion of the doping material from the electrode layers into the second ceramic material during sintering occurs at a temperature of between 800 and 1300° C. For example, a temperature of between 950 and 1050° C. is possible when doping via copper, and a sintering temperature of between 1000 and 1200° C. is possible when doping via silver/palladium.

In the following, the invention will be explained in greater detail, using exemplary embodiments and the related figures.

DETAILED DESCRIPTION

Figure 1:
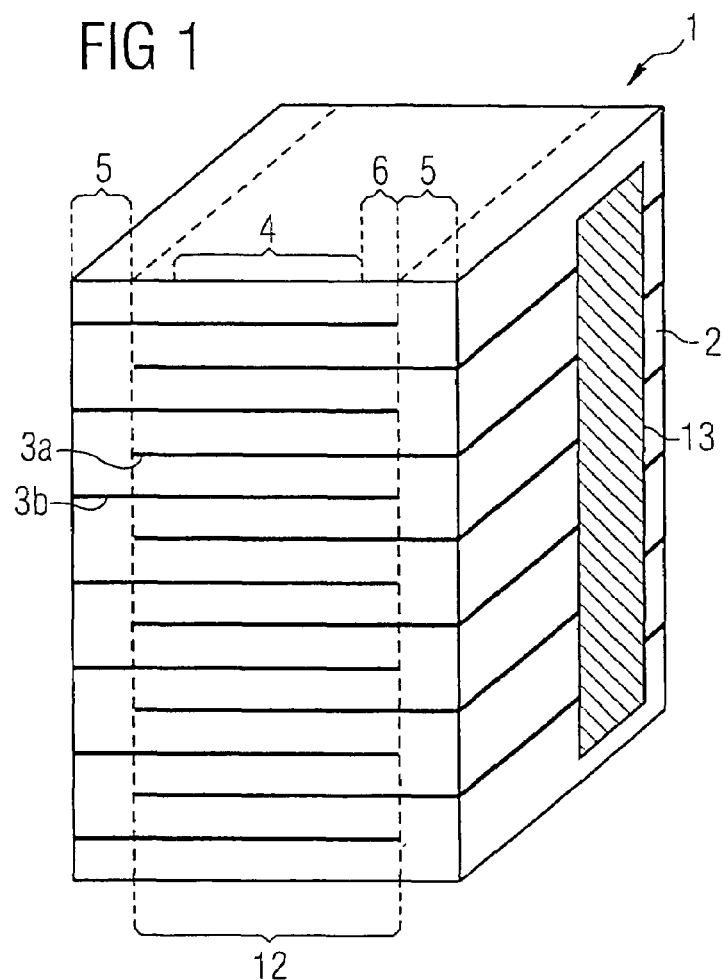
FIG. 1 shows a piezoelectric component according to the invention, as an example, in a perspective view.
Figure 4:
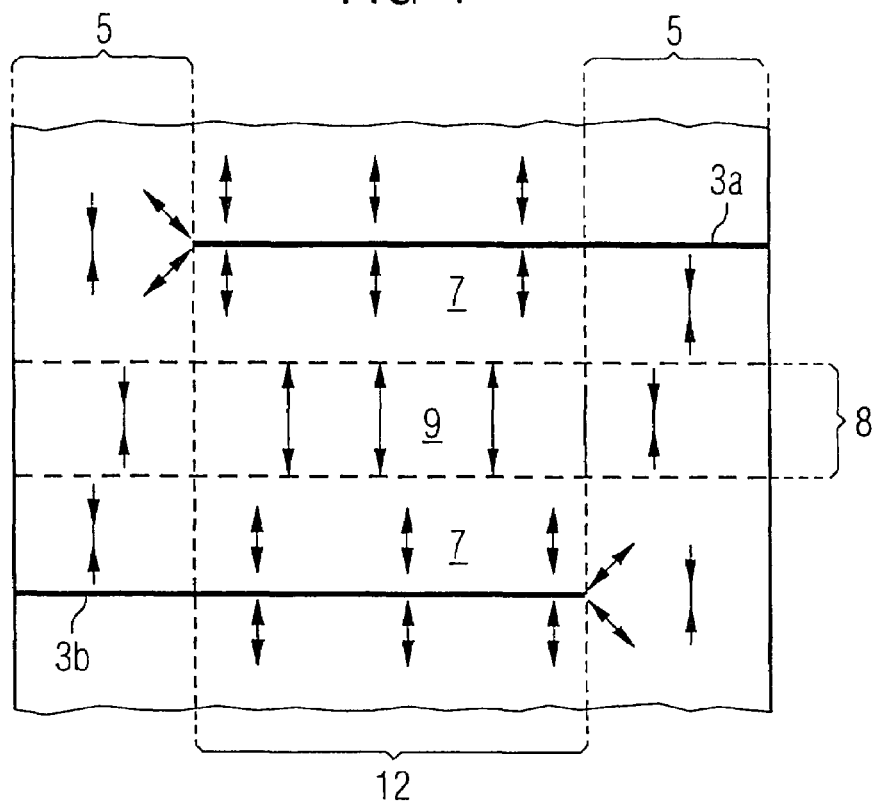
FIG. 4 shows various zones of compressive stress and tensile stress, according to the example from FIG. 2.

FIG. 1 shows a piezoactuator having a stack 1 of piezoelectric layers 2 stacked on top of one another, and electrode layers 3a, 3b. In this arrangement, a first type of electrode layers 3a alternates with a second type of electrode layers 3b. The electrode layers 3a, 3b, each of one type, can be jointly contacted by a metal strip 13 arranged on the exterior of the stack 1. By applying pulsed electric voltages having different polarity to the electrode layers 3a and the electrode layers 3b, respectively, it is possible to make each pair of electrode layers 3a and 3b arranged opposite one another generate an electric field at the piezoelectric layers 2, thus producing a vertical lift of the piezoactuator. The electrode layers 3a, 3b, each originating in various edge zones of the stack 1, do not extend to the opposite side of the stack 1, leaving an edge zone 5 free. The edge zones 5 of the stack 1 are the passive zones, in which the piezoelectric material 2 is essentially exposed to a tensile stress. This is shown in FIG. 4. The region in which the electrode layers 3a, 3b overlap directly is the active zone 12, in which the piezoelectric layers are essentially exposed to compressive stress (again, see FIG. 4).

The dimensions of the component can comprise 7×7 mm in area and 30 mm in height, for example. This makes it possible to integrate at least 360 internal electrodes into the piezoelectric component. It is also possible to produce so-called benders, which have an area of 20×6 mm and a height of 1.5 mm. Such benders have 20 internal electrodes, for example.

The electrode layers 3a and the electrode layers 3b can each be comb structures, where the comb structures are arranged in the component as combs pushed into one another. This makes it possible to achieve a large mechanical lift of the piezoactuator. The actual shape of the electrode layers 3a, 3b is irrelevant, the only important aspect being that only every other electrode is present in a region perpendicular to the level of the electrodes, the so-called passive zone.

The PZT ceramic materials that are normally used can be used for the piezoelectric layer 2.

Figure 2:
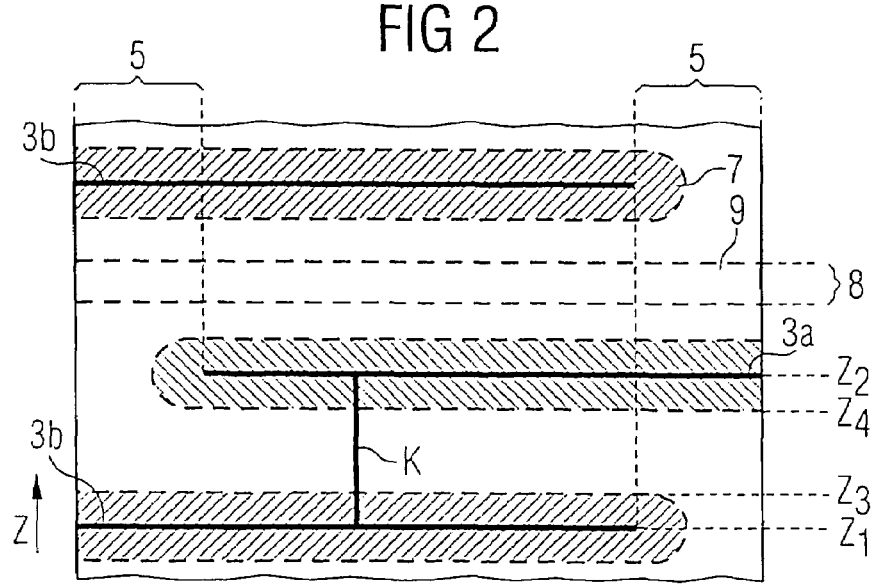
FIG. 2 shows an enlarged detail of the component from FIG. 1, in schematic cross-section.

FIG. 2 shows a detailed section of the component from FIG. 1. The electrode layers 3a, 3b are enclosed by a first ceramic material 7, which demonstrates a lower relative expansion when electric voltage is applied. A second piezoelectric material 9 with a higher relative expansion is arranged in a middle region 8 between two adjacent electrode layers 3a, 3b. The first piezoelectric material 7 not only encloses the end segment of the electrode layers 3a, 3b, but also the electrode layers 3a, 3b in their entirety. The first piezoelectric material 7 is produced from the second piezoelectric material 9 by diffusing in doping materials present in the electrode layers 3a, 3b. A possible doping material is copper, for example. The doping can be achieved via a temperature step, which is performed during sintering of the component.

Figure 3:
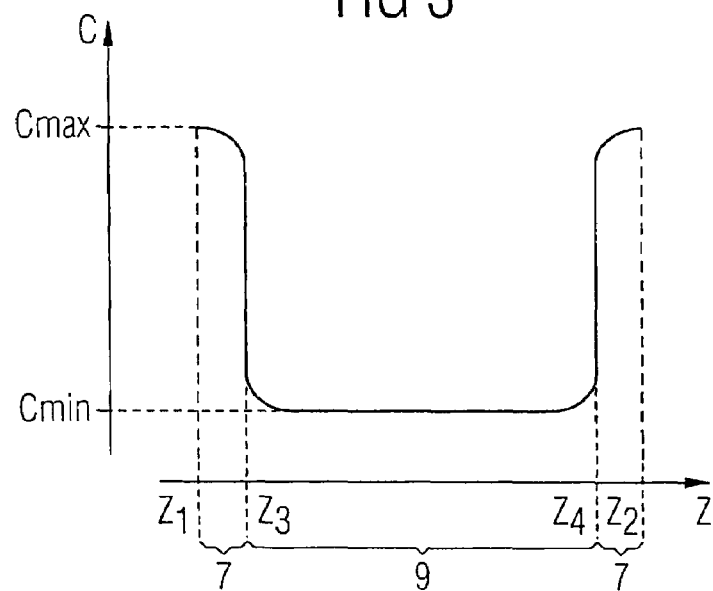
FIG. 3 shows a concentration profile, as an example, along line K from FIG. 2.

FIG. 3 shows, in model form, the relative concentration c of a doping material along line K from FIG. 2. The electrode layers 3b and 3a, respectively, are arranged at positions $Z_1$ and $Z_2$. Between positions $Z_1$ and $Z_2$, the concentration of doping material gradually decreases, fluctuating between a maximum doping material concentration $c_{max}$ and a minimum doping material concentration $c_{min}$. The first piezoelectric material 7, which exhibits a relatively low expansion, is located in this zone. The low expansion is brought about by modification of the second piezoelectric material 9, which exhibits a high expansion. A zone with a relatively low doping material concentration $c_{min}$ is located between positions $Z_3$ and $Z_4$, this being the second piezoelectric material 9, which exhibits a high relative expansion. $c_{min}$ can be very small or, if applicable, equal to zero.

FIG. 3 also shows that a gradual transition between the different piezoelectric materials 7, 9 can be achieved by modifying the second piezoelectric material 9 via doping.

The electrode layers 3a, 3b can be provided, for example, in the form of silk-screened electrodes spaced at 20 to 200 µm apart. In addition to copper, other chemical elements are possibilities for doping materials. These possibilities include, in particular, those doping materials that are used in the production of harder PZT ceramics, if the piezoelectric constants decrease as the concentration increases.

In this arrangement, the doping material concentration 3 continuously decreases from the electrode layers 3a, 3b toward the middle region 8 between the electrode layers 3a, 3b. This ensures that there is a piezoelectric material with a low relative expansion, especially in proximity to the electrode layers 3a, 3b.

Figure 3A:
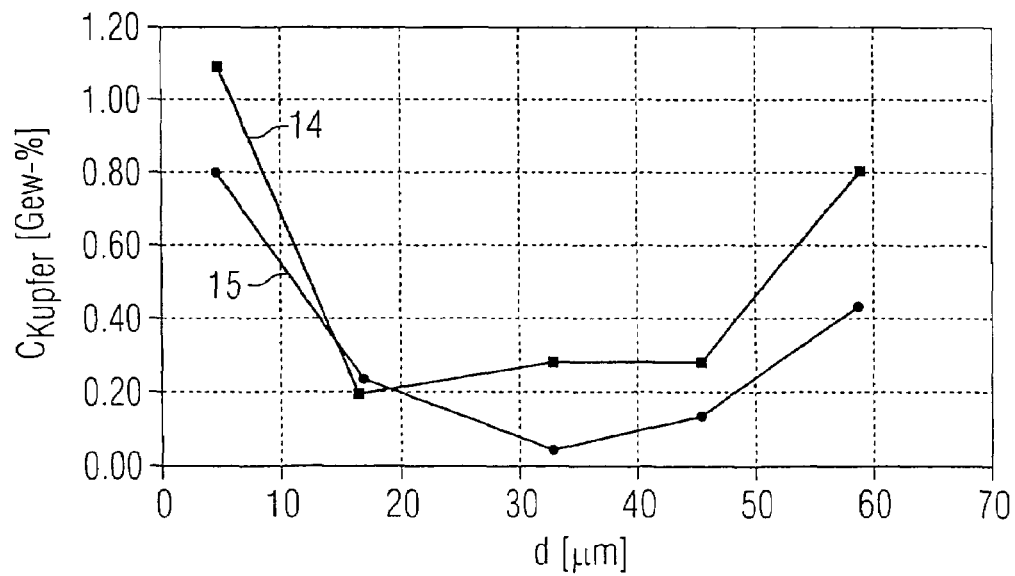
FIG. 3A shows a suitable concentration profile along line K from FIG. 2.

FIG. 3A shows, as an example, the concentration of the doping material copper in weight percent along line K from FIG. 2. In this arrangement, the copper concentration $C_{copper}$ is portrayed as a function of the distance d from the internal electrode located at $Z_2$. The second internal electrode 3b is at d=70 µm, which corresponds to the position $Z_1$ from FIG. 2 or from FIG. 3. In this arrangement, it was assumed that the ceramic material $Pb_{0.97}Zr_{0.54}Ti_{0.46}Nd_{0.02}O_3$ is the second piezoelectric material. In the example shown in FIG. 3A, the internal electrodes 3a, 3b are copper electrodes. By diffusion during sintering at a temperature of 1000° C. and for a period of about 5 hours, the concentration profile measured in FIG. 3A via WDX/EDX measurement was achieved. The concentration progression of the copper in the second piezoelectric material qualitatively corresponds to the concentration progression portrayed in model form in FIG. 3. In the region between a distance d=0 and d=18 µm, or in a region between d=45 and d=70 µm, a first piezoelectric material was produced from the internal electrodes 3a, 3b via diffusing in the copper which exhibits a smaller relative expansion than the second piezoelectric material. In this arrangement, the first curve 14 describes the starting material for the second piezoelectric material, as indicated above, and the second curve 15 describes, as starting material, the same material as indicated above and portrayed for the first curve 14, but with an additional copper doping of ca. 1 to 2 mol. %. In this connection, one mol. % Cu concentration corresponds to 0.196 weight percent.

In the case of the lead zirconium titanate specified above, a relative expansion of 690 pm/V can be reduced by doping with more than 1 mol. % copper so as to result in a relative expansion of <650 pm/V. In this arrangement, the relative expansion values are measured as an excursion of a biased actor in a multilayer structure, which was suitably polarized and to which a field intensity of about 2 KV/mm was applied. The relative expansion can be further reduced by increasing the copper content.

FIG. 4 shows the relationships in the lower portion of FIG. 2 with regard to the occurrence and relative intensity of compressive or tensile stress when an electric charge is applied to the actor. Compressive stress occurs primarily in the active zone 12. Because of the low expansion of the first piezo electric material, the compressive stress is relatively low in the zones labeled with the reference number 7. The compressive stress occurring in the zone labeled with the reference number 9 is relatively great, because this is where the second piezoelectric material is located. In the edge zones 5, the compressive stress is replaced by a tensile stress. Compressive stress is symbolized by <--> and tensile stress by >--<. In this connection, the length of the double arrows is only a rough guide; in particular, the indicated voltage is not proportional to the length of the arrows.

Figure 5:
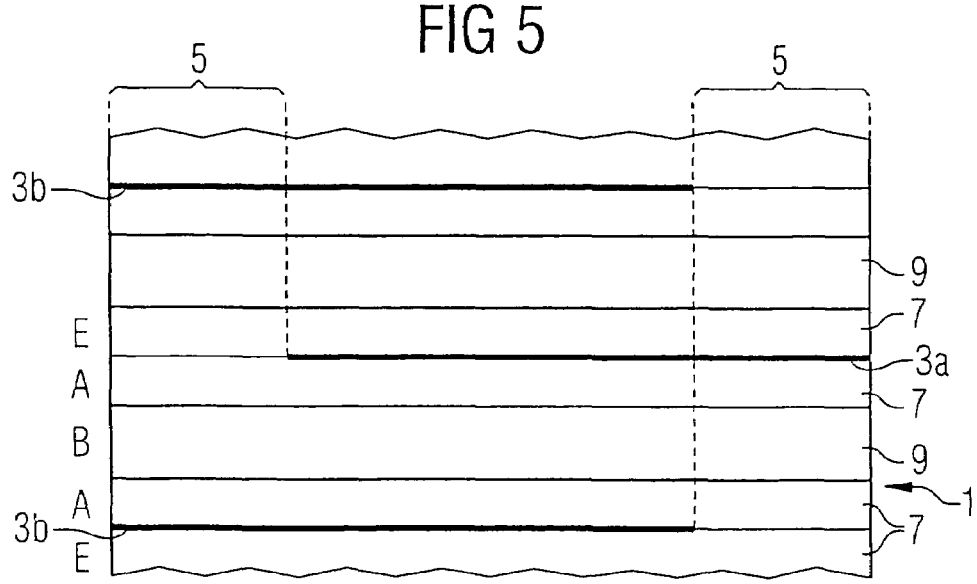
FIG. 5 shows another piezoelectric component according to the invention, as an example, in schematic cross-section.

FIG. 5 shows another exemplary embodiment of the invention, where analogous reference is made to a piezo actuator shown in FIG. 1. In contrast to FIG. 2, the first piezo electric material, according to FIG. 5, is not produced via diffusion of a doping material, but instead is produced internally by using a suitable ceramic green film. Thus, FIG. 5 describes a layer stack having the sequence E-A-B-A-E. In this arrangement, a ceramic green film that contains a first piezoelectric material 7 is placed over an electrode layer 3b. This is followed by a green film that contains a second piezoelectric material 9. This is followed, in keeping with the sequence, by a layer A and then by an electrode layer 3a. Each of the ceramic films used in the ceramic layers for A and B can be based on a PZT-based ceramic, wherein the adjustment of the relative expansion of the respective piezoceramic material, i.e., the piezoelectric material 7, 9 is achieved by either adding one or more doping materials or by varying the zirconium/titanium ratio. The two named measures can also be combined.

In this arrangement, the layer thicknesses of the ceramic green films can comprise between 20 and 200 µm. Other layer thicknesses are also possible.

The thickness of the electrode layers 3a, 3b comprises between 5 and 10 µm.

In the embodiment according to FIG. 5, it also applies that a first piezoelectric material 7 with a low relative expansion encloses not only the end segments 6 of the electrode layers 3a, 3b, but also the entire electrode layers 3a, 3b.

Figure 6:
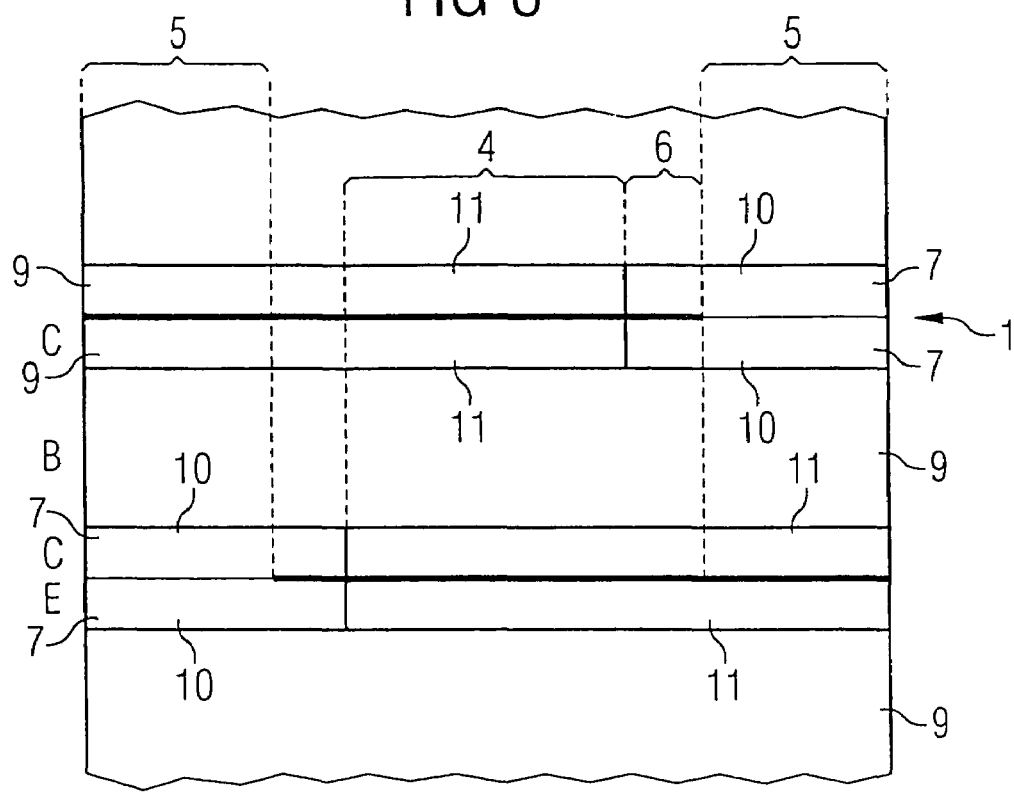
FIG. 6 shows another piezoelectric component according to the invention, as an example, in schematic cross-section.

FIG. 6 shows another exemplary embodiment of the invention, wherein the structure of the stack 1 corresponds to that of FIG. 5, except that layer A is replaced by layer C in the layer sequence. In this arrangement, layer C does not comprise a ceramic green film, but instead is comprised of two silk-screened layers 10, 11. These two silk-screened layers 10, 11 are combined into a layer C that continues across the entire cross-section of the piezoactuator. The advantage of the silk-screened layers 10, 11 is that they can be implemented to be significantly thinner than the ceramic green films according to FIG. 5. This achieves the advantage that the total lift of the piezoactuator is compromised as little as possible. As a result, it is possible to produce silk-screened layers 10, 11 having a thickness of 3 to 10 µm, for example. The silk-screened layer 10 contains a first piezoelectric material 7 having a low relative expansion. The silk-screened layer 10 covers both the upper side and the lower side of the respective end segment 6 of the electrode layer 3a, 3b. As a result, the end segment 6 of the electrode layers 3a, 3b is enclosed by the first piezoelectric material 7. Each silk-screened layer 11, which supplements the silk-screened layers 10 to make a complete stack layer C, covers the middle segment 4 of the electrode layers 3a, 3b on the upper side and the lower side. In this connection, the silk-screened layer 11 contains the second piezoelectric material 9, which is also located in the middle region 8 between the adjacent electrode layers 3a, 3b.

As a result of the structure according to FIG. 6, only the critical end segments 6 of the electrode layers 3a, 3b are enclosed by the first piezoelectric material. This is advantageous because it results in the total lift of the piezoactuator being compromised as little as possible.

A significant feature of the invention is that the end segments of the electrode layers are enclosed by a piezoelectric material having a relatively low expansion. The invention is not limited to embodiments in which the entire electrode layers are enclosed by the first piezoelectric material.

The invention claimed is:

1. A piezoelectric component comprising:
piezoelectric layers; and
electrode layers between at least some of the piezoelectric layers; the electrode layers defining a middle segment in an interior of the piezoelectric layers and end segments between ends of at least some of the electrode layers and an end of at least one of the piezoelectric layers;
wherein the piezoelectric layers comprise a first piezoelectric material at the end segments and a second piezoelectric material at the middle segment between electrode layers, the first piezoelectric material having a first expansion that is less than a second expansion of the second piezoelectric material.

2. The piezoelectric component of claim 1, wherein the first expansion comprises at most 95% of the second expansion.

3. The piezoelectric component of claim 2, wherein the first expansion comprises at most 90% of the second expansion.

4. The piezoelectric component of claim 1, wherein a surface area of at least one of the edge segments comprises at least 5% of a surface area of a corresponding electrode layer.

5. The piezoelectric component of claim 1, wherein a transition from the first expansion in the first piezoelectric material to the second expansion in the second piezoelectric material is substantially constant.

6. The piezoelectric component of claim 1, wherein the first piezoelectric material comprises the second piezoelectric material diffused with a doping material from at least one of the electrode layers.

7. The piezoelectric component of claim 6, wherein the doping material comprises copper.

8. The piezoelectric component of claim 6, wherein the first piezoelectric material comprises $Pb_{0.97}Zr_{0.56}Ti_{0.46}Nd_{0.02}O_3$ with a copper content of 3–10 mol. %, and the second piezoelectric material comprises $Pb_{0.97}Zr_{0.56}Ti_{0.46}Nd_{0.02}O_3$ with a copper content of 1–2 mol. %.

9. The piezoelectric component of claim 1, wherein the piezoelectric layers and electrode layers form a stack that has a layer sequence of E-A-B-A-E; and
wherein E comprises an electrode layer, A comprises a ceramic film that contains the first piezoelectric material, and B comprises a ceramic film that contains the second piezoelectric material.

10. The piezoelectric component of claim 1, wherein the piezoelectric layers and electrode layers form a stack that has a layer sequence of E-C-B-C-E; and
wherein E comprises an electrode layer, C comprises a layer formed by first and second silk-screened layers that are adjacent, and B comprises a ceramic film that contains the second piezoelectric material; and
wherein the first silk-screened layer comprises the first piezoelectric material and covers at least one end segment, and the second silk-screened layer comprises the second piezoelectric material and covers at least part of the middle segment.

11. The piezoelectric component of claim 10, wherein the first and second silk-screened layers completely cover layer B, and the first and second silk-screened layers extend to an inner edge of at least one end segment.

12. The piezoelectric component of claim 1, wherein the is piezoelectric layers and the electrode layers comprise a monolithic sintered compact.

13. The piezoelectric component of claim 1, wherein the electrode layers comprise copper.

14. A piezoelectric component comprising:
a stack comprising layers of a first piezoelectric material;
electrode layers arranged between layers of the first piezoelectric material, the electrode layers extending from an exterior of the stack to an interior of the stack, the electrode layers having a length that is less than a length of the stack such that there is first piezoelectric material between an exterior of the stack and end segments of at least some of the electrode layers at an interior of the stack; and
a second piezoelectric material that substantially covers at least some of the electrode layers, the second piezoelectric material having an expansion that is less than an expansion of the first piezoelectric material.

15. The piezoelectric component of claim 14, wherein the electrode layers extend alternately from different exteriors of the stack to an interior of the stack.

16. The piezoelectric component of claim 14, wherein the second piezoelectric material comprises the first piezoelectric material diffused with a doping material from at least one of the electrode layers.

* * * * *

UNITED STATES PATENT AND TRADEMARK OFFICE
CERTIFICATE OF CORRECTION

| | | |
|---|---|---|
| PATENT NO. | : 7,208,862 B2 | Page 1 of 1 |
| APPLICATION NO. | : 10/501974 | |
| DATED | : April 24, 2007 | |
| INVENTOR(S) | : Heinz Florian and Sigrid Ragossnig | |

It is certified that error appears in the above-identified patent and that said Letters Patent is hereby corrected as shown below:

On the Title Page Item (75),

Delete "Gross St. Florian" and Insert -- Friesach --

Col. 7 line 32,

Delete "edge" and Insert -- end --

Signed and Sealed this

Thirtieth Day of October, 2007

JON W. DUDAS
*Director of the United States Patent and Trademark Office*